United States Patent [19]
Montress et al.

[11] 4,191,933
[45] Mar. 4, 1980

[54] DIFFERENTIAL MIXING SURFACE ACOUSTIC WAVE SIGNAL PROCESSOR

[75] Inventors: Gary K. Montress; Thomas W. Grudkowski, both of Glastonbury, Conn.; Thomas M. Reeder, Portland, Oreg.

[73] Assignee: United Technologies Corporation, Hartford, Conn.

[21] Appl. No.: 967,322

[22] Filed: Dec. 7, 1978

[51] Int. Cl.² ............... H03H 9/26; H03H 9/30; G06G 7/19; H03C 1/46
[52] U.S. Cl. .................... 333/151; 332/26; 333/154; 333/166; 333/194; 364/821
[58] Field of Search ............... 333/150–155, 333/166, 190–195; 364/821, 825; 332/26; 330/5.5; 331/107 A; 310/313; 329/117–118, 193, 198, 154, 160, 207

[56] References Cited

U.S. PATENT DOCUMENTS

| | | | |
|---|---|---|---|
| 3,634,774 | 1/1972 | Carr | 330/5.5 |
| 3,723,916 | 3/1973 | Speiser et al. | 310/313 X |
| 3,803,395 | 4/1974 | Quate | 310/313 X |
| 3,942,135 | 3/1976 | Moor et al. | 332/26 X |
| 4,016,513 | 4/1977 | Solie | 330/5.5 X |
| 4,016,514 | 4/1977 | Reeder et al. | 333/150 |
| 4,024,480 | 5/1977 | Reeder et al. | 364/825 |
| 4,114,116 | 9/1978 | Reeder et al. | 333/150 |

*Primary Examiner*—Alfred E. Smith
*Assistant Examiner*—Marvin Nussbaum
*Attorney, Agent, or Firm*—M. P. Williams

[57] ABSTRACT

A surface acoustic wave signal processor having a plurality of taps, each connected to an external nonlinear device are arranged in pairs, each pair having its phase center aligned for interception of propagating waves at the same transversal distance from the launching thereof, the taps having configurations so that each tap in the pair receives signals at a phase which is inverted (180° out of phase) with respect to corresponding signals received at the other tap of the pair, the product mixing output of the external nonlinear device for each tap being summed with the like output for the other tap in the pair, whereby all waves intercepted by the tap pair are cancelled at the product mixer outputs, along with certain of the components of product mixing having odd-ordered exponents. Disclosed configurations include tilted taps with co-propagating waves, longitudinally aligned taps with counter-propagating waves, and co-linear taps with plural channel, transversally displaced waves. Usage with internal mixing is also described.

2 Claims, 3 Drawing Figures

DIFFERENTIAL MIXING SURFACE ACOUSTIC WAVE SIGNAL PROCESSOR

The Government has rights in this invention pursuant to Contract No. N00173-76-C-0373 awarded by the Department of the Navy.

BACKGROUND OF THE INVENTION

1. Field of Art

This invention relates to tapped, surface acoustic wave (SAW) signal processors, and more particularly to processors employing phase-inverted tap pairs for differential operation that provides significant unwanted component cancellation.

2. Description of the Prior Art

Surface acoustic wave (SAW) signal processing is well known, and may be employed to perform a variety of signal combining/comparing functions, some of which are described in Reeder and Gilden U.S. Pat. No. 4,016,514. These include correlation, convolution, time inversion, and the like. When the SAW signal processors include programmability of the taps, to provide a phase and amplitude programmable, general transversal filter, as in Reeder and Grudkowski U.S. Pat. No. 4,024,480, additional functions, such as programmable correlation, multiplexing, and the like may be performed. Programmable taps may be used in conjunction with other SAW device parameters to provide still additional functions, such as discrete Fourier transformation in a parallel channel processor, as disclosed in Reeder U.S. Pat. No. 4,114,116.

The processors described hereinbefore employ nonlinear product mixing which is achieved in external devices. As is well known in the art, the output of nonlinear product mixing, such as may be effected in suitably biased diodes, includes many components, of which the two fundamental frequencies are the most dominant because they are the strongest and also because they have the largest transfer characteristic within the mixing process. Because the signal processing itself, such as correlation or convolution, manifests its results in those components of product mixing which are generated by the combination of the two fundamental frequencies, and are jointly dependent on both frequencies, it is common to select either the sum or difference frequency as the desired output and use a bandpass filter to significantly reject the remaining components of product mixing, as well as the fundamental components. Summation of the outputs at the sum or difference frequency of many identical taps of a P tap array provides a signal representation of the desired convolution or correlation summation between the two input waves, or between one or both waves and any tap weighting which may be involved. Although the correlation function is not itself hampered by variations in amplitude of the components of incoming signals being correlated, when amplitude weighting is employed, the resultant component at the output of the mixer for any one tap can be much lower than the signal strength of components of product mixing for others of the taps. The filtering out of the desired components to extract an extremely weak signal from amongst much stronger signals therefore becomes difficult. Additionally, unless perfect isolation is provided, which is generally not feasible, unwanted mixing of components from one tap within the mixer of another tap can occur. As disparity in amplitude weighting is increased, the likelihood of desired mixer output components being near the same level as undesired mixer output components is also increased. Resulting spurious signals and difficulties of filter design combine to provide amplitude and phase errors which become progressively worse with increased diversity in amplitude weighting.

An example of the need for sophisticated output filtering is given in Colvin, R. D. et al, Monolithic SAW Mixer with Single Sideband Output, IEEE 1978 Ultrasonics Symposium Proceedings. Therein, dual channel mixing having stagger-tuned output transducers for wider bandwidth is described; it, however, requires a dual channel SAW filter for sufficient spurious signal suppression.

Phase reversal of piezoelectric waves detected by segmented taps, by selection of different segments for the common and distinct outputs with respect to the tap phase center, is well known as illustrated by Hunsinger, B. J., et al, Programmable Surface-Wave Tapped Delay Line, IEEE Transactions on Sonics and Ultrasonics, Vol. SU-18, No. 3, July 1971, pp 152–154; and by Moore et al U.S. Pat. No. 3,942,135. Also, phase reversal of the results of internal product mixing is known in Davis, K. L., Zinc Oxide-On-Silicon Programmable Tapped Correlator, IEEE Ultrasonic Symposium Proceedings, pp 456–458. However, in Davis, all generated signals are phase reversed when the tap phase is reversed.

In addition to the aforementioned Reeder patent, multichannel SAW devices for various purposes are disclosed in Speiser et al U.S. Pat. No. 3,723,916; in Quate U.S. Pat. No. 3,803,395; and in Grudkowski, T. W., and Reeder, T. M., Programmable Transversal Filtering Using Nonlinear Tapped Delay Lines, IEEE 1977 Ultrasonics Symposium Proceedings, pp 710–714.

SUMMARY OF THE INVENTION

Objects of the invention include substantial reduction in fundamental frequency components and other spurious signals at the output of nonlinear product mixing in SAW signal processors.

This invention is predicated on the fact that a multifinger acoustoelectric transducer tap has a phase center, for each period of tap structure at the center design frequency thereof, the phase of electric signals induced by the acoustic wave beneath each tap being controlled by the relative position of the grounded and signal finger sets, the phase (eg, $\pm\pi$) for each tap being totally independent of the frequency of the acoustoelectrically sensed wave, the electric waves sensed being phase reversed at all frequencies to which the tap is responsive (even outside of the nominal bandwidth of the tap).

According to the present invention, a multi-tap SAW signal processor, employing nonlinear product mixing of waves propagating in the interaction region of the SAW device, has taps arranged in pairs, each tap of each pair being substantially identical to the other tap of the pair except for the fact that the transducer fingers of one tap in the pair are disposed so that unwanted signals acoustoelectrically produced by one tap of the pair are phase reversed from unwanted signals acoustoelectrically produced by the other tap of the pair, which may therefor be combined for substantial mutual cancellation, while the desired components of product mixing are in phase and therefor additive.

The invention may find its greatest utility in external mixing configurations, in which large fundamental feed through and other spurious signals are inherent; however, it may be utilized to advantage in certain internal mixing configurations where desired component phase is controllable separately from fundamental phases, and large bandwidth tap structure is employed so that inherent rejection of unwanted signals is limited.

The invention provides common mode rejection of all signals sensed by the taps of a pair, and all signals which include similar terms but odd exponents which are produced in the nonlinear product mixer circuitry for each tap, while at the same time providing an essentially double-strength signal for those components of nonlinear product mixing which are in phase, including sum and difference frequency components resulting from the product mixing of a pair of waves sensed by the taps, with or without amplitude and/or phase weighing of the taps.

The invention provides significant fundamental and spurious signal reduction in product mixing output of SAW processing devices, without losing the higher efficiency of external mixing nor the relative flexibility for hybrid device construction in which the SAW module may be utilized with a variety of tap programming and a signal processing apparatus, not formed integrally therewith. The invention may be practiced utilizing SAW technology, fabrication techniques, materials and the like which are all known and available in the art. The invention may be utilized in a wide variety of processing applications, to achieve results less affected by spurious signals while at the same time easing filtering requirements and allowing a greater disparity in tap amplitude and/or phase weighting.

The foregoing and other objects, features and advantages of the present invention will become more apparent in the light of the following detailed description of exemplary embodiments thereof, as illustrated in the accompanying drawing.

DETAILED DESCRIPTION

Figure 1:
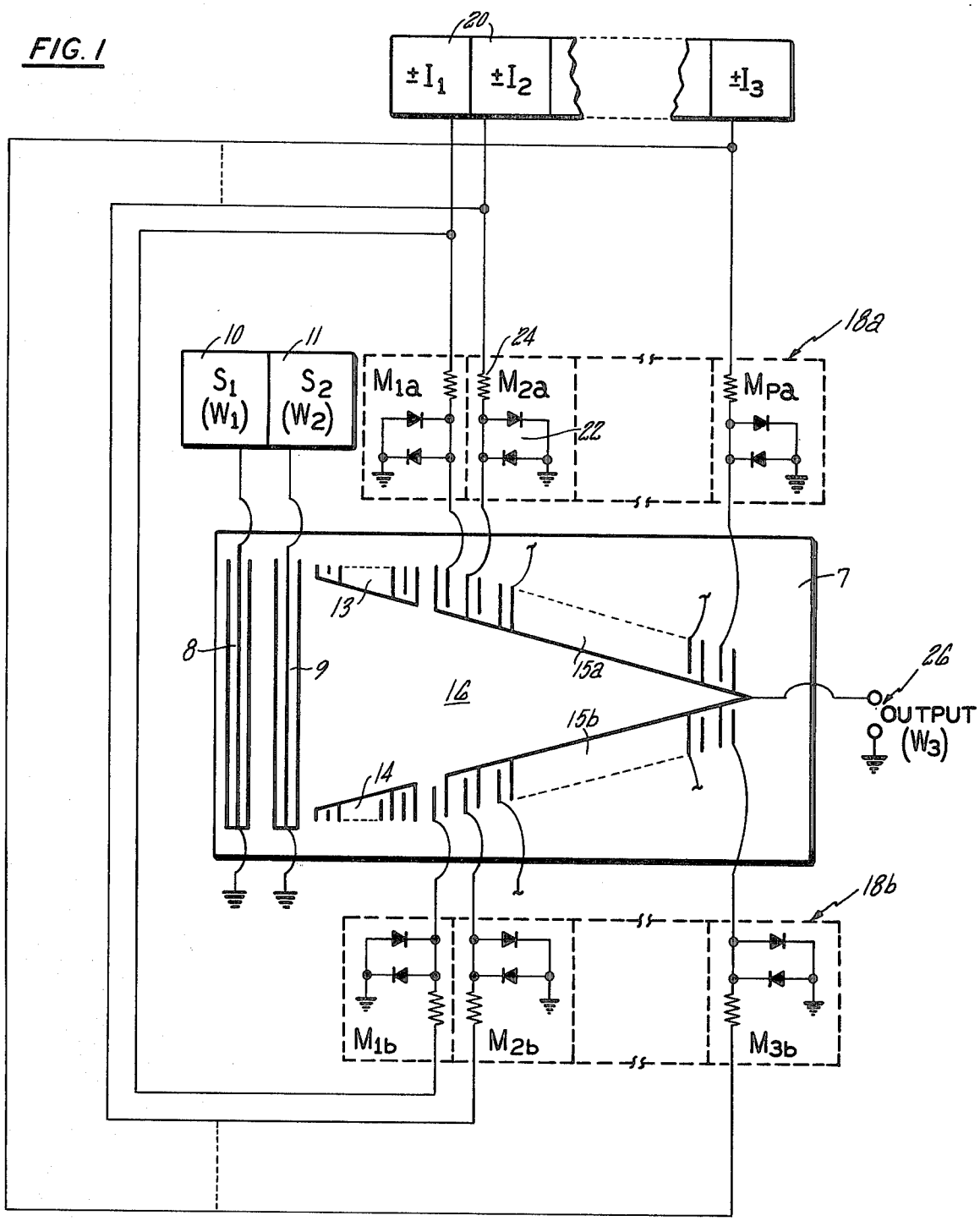
FIG. 1 is a simplified, schematic plan view of a SAW module in accordance with the present invention, and associated circuitry.

Referring now to FIG. 1, a SAW signal processing module in accordance with the present invention in a tilted-tap, co-propagating wave embodiment is formed on a substrate 7 of a suitable piezoelectric material. The mterial may comprise lithium niobate, gallium arsenide, or a layer of zinc oxide on a suitable underlayment, such as silicon; the substrate may comprise any other known suitable piezoelectric material. On the substrate 7 there is disposed a pair of ordinary launching transducers 8, 9 which may be of the known interdigital finger type. Each launching transducer 8, 9 is connected to a corresponding signal source 10, 11 for providing signals which are to be correlated, time inverted, or the like, or one signal which is to be correlated with tap weightings along with a local oscillator carrier signal, to permit product mixing at the taps. The sources 10, 11 may provide any signals suitable for the processing to be employed in apparatus utilizing the module of the present invention, all of which are widely known in the art.

The substrate 7 may have a plurality of dummy taps or fingers 13, 14 disposed thereon in advance of a plurality of interdigital taps 15a, 15b disposed on opposite sides of an interaction region 16 in the known, tilted-tap configuration. The taps may be conveniently thought of as being designated 1 through P, as identified by the nomenclature of the specific circuitry associated therewith which is described hereinafter. Each of the taps 15a is disposed with its phase center aligned with respect to the waves launched by the transducers 8, 9 so that any signals acoustoelectrically produced thereat are phase inverted with respect to those at a corresponding one of the taps 15b. In the simplest sense, this means that each of the taps 15a has a phase center which is longitudinally displaced from the transducers 8, 9 the same distance as a corresponding one of the taps 15b, but the roles of the fingers (signal or ground, for instance) are reversed. Although shown herein as simple pairs of fingers, each of the taps 15a, 15b would normally be composed of a large number of fingers in dependence upon the particular design chosen. And, the spacing and size of the fingers within each tap is a function of the desired design parameters, known in the art. For instance, one commonly used tap configuration is an eighth-period interdigital transducer in which each finger has a width of $\frac{1}{8}$ of a period (where a period is one wavelength of the design center frequency of the tap at the inherent propagation velocity for the substrate), and each of the fingers is also spaced by $\frac{1}{8}$ of a period, two adjacent fingers being connected to one side (eg, common or distinct) and alternative pairs of adjacent fingers being connected to the other side (eg, distinct or common). Normally, several periods (24 fingers or more) may typically be used. This form of tap is known to have good cancellation of cumulative reflections from period to period of the tap portions, and to generate fewer spurious signals than some other structures, such as the fourth-period type of tap. The number of fingers, or periods, for a tap is, as is known, a trade-off between insertion loss and bandwidth. The fewer the fingers, the broader the bandwidth; the more fingers, the lower the insertion loss. However, in the context of the present invention, the bandwidth constraint on a resulting interdigital tap design is a function only of its passband of insertion loss which is 3 dB down. The tap is designed for an insertion loss that satisfies the band-pass requirements for the two fundamental frequencies launched in the waves to which the taps must be responsive. Normally, the design center frequency of the tap will be midway between these two frequencies. However, as stated briefly hereinbefore, for any given tap, the tap structure and physical location controls phase of the sensed signals, even though the sensed signals do not have a wavelength equal to the periodicity of the tap fingers. This is due to the cumulative addition of phasor components across the entire set of fingers for each tap. Therefore, tap structures for use in accordance with the present invention are designed for band-pass as is known, in order to accommodate the desired frequencies of waves propagating in the substrate, and, in the utilization illustrated in FIG. 1, complete phase inversion of any signal at any frequency to which the tap can respond is achieved by reversing the roles of alternative fingers (or finger pairs) between connection in common (output, in FIG. 1) and connection to distinct circuits (bias, in FIG. 1).

The remaining circuitry illustrated in FIG. 1, as associated with the SAW module in accordance with the present invention, is all conventional. This includes a plurality of biased mixer circuits 18a, 18b, each of the mixer circuits 18a being driven by the same one of a bias current source 20 as a corresponding one of the mixer circuits 18b. Each of the mixer circuits 18 include a pair of anti-parallel diodes 22 and a series bias resistor 24. The elements 18-24 may be as described in the aforementioned Reeder and Grudkowski patent. In addition to the differential arrangement of taps in accordance with the present invention, the exemplary circuit configuration of FIG. 1 differs from that of the Reeder and Grudkowski patent in that the output herein is taken at an output port 26 which is directly connected to the common fingers of the taps 15a, 15b, rather than being collected from isolation networks interposed between the mixer circuits 18 and the current sources 20 as in the Reeder and Grudkowski patent. This is equivalent, however, since the mixers and taps form a series circuit and the response therefrom can be taken at any point in the circuit. But this configuration is different in that isolation is not provided, since the isolation is principally required in the aforementioned patent to prevent remixing of mixed components, principally as a consequence of fundamental frequencies passing through the mixers; in accordance with the invention, the fundamental frequencies are essentially self-cancelling as a consequence of the differential common mode rejection provided by the phase inversion of the taps.

The configuration illustrated in FIG. 1, employing a module of the invention, may be utilized as a programmable general transversal filter by providing bias current from the sources 20 which vary in amplitude and in biphase to control the mixer efficiency of the mixer circuits 18 for the processing which is desired to be performed. However, since all of the functions which can be performed utilizing a differential SAW module in accordance with the present invention are the same as those known to the prior art without the advantages of the invention, further description is not given herein. For examples of processing which may be performed with apparatus employing the present invention, while at the same time achieving the common mode rejection of fundamental and other undesired components, reference may be had to any of the Reeder and Reeder et al patents referred to hereinbefore. In FIG. 1, the taps 15 are depicted as being equally spaced along the interaction region 16. However, the invention may obviously be employed in situations where the tap spacing is tailored to suit some particular need.

Figure 2:
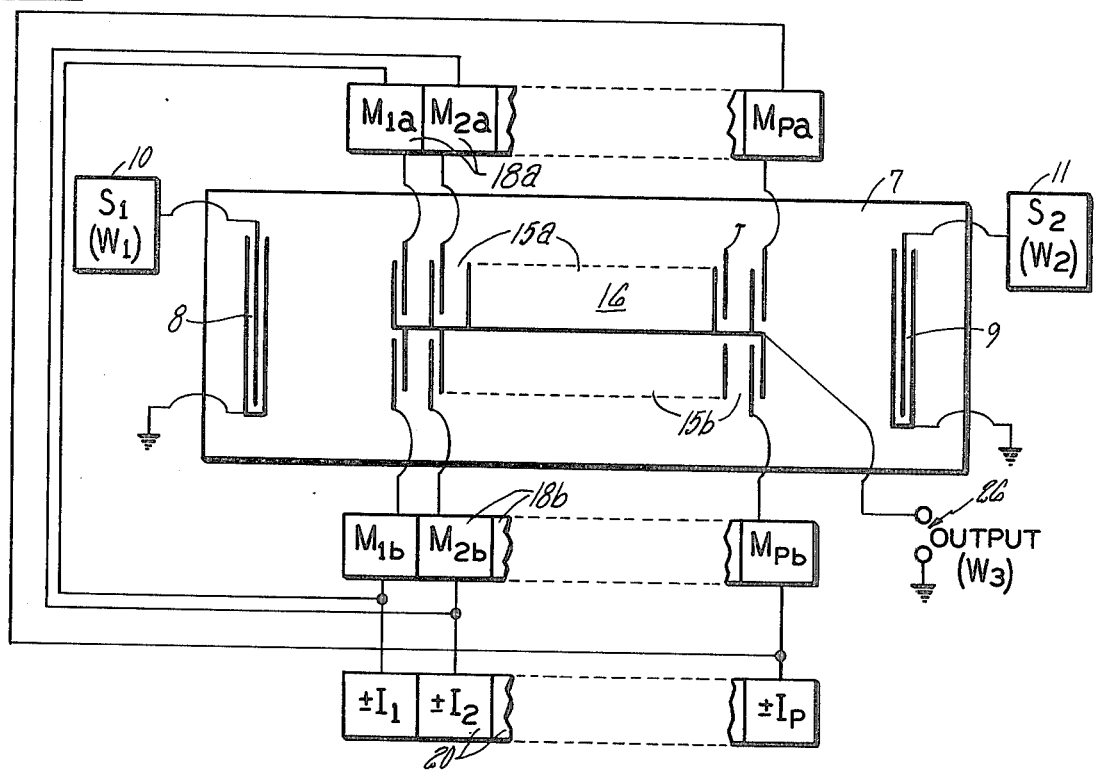
FIG. 2 is a simplified, schematic plan view of the invention embodied in a second form.
Figure 3:
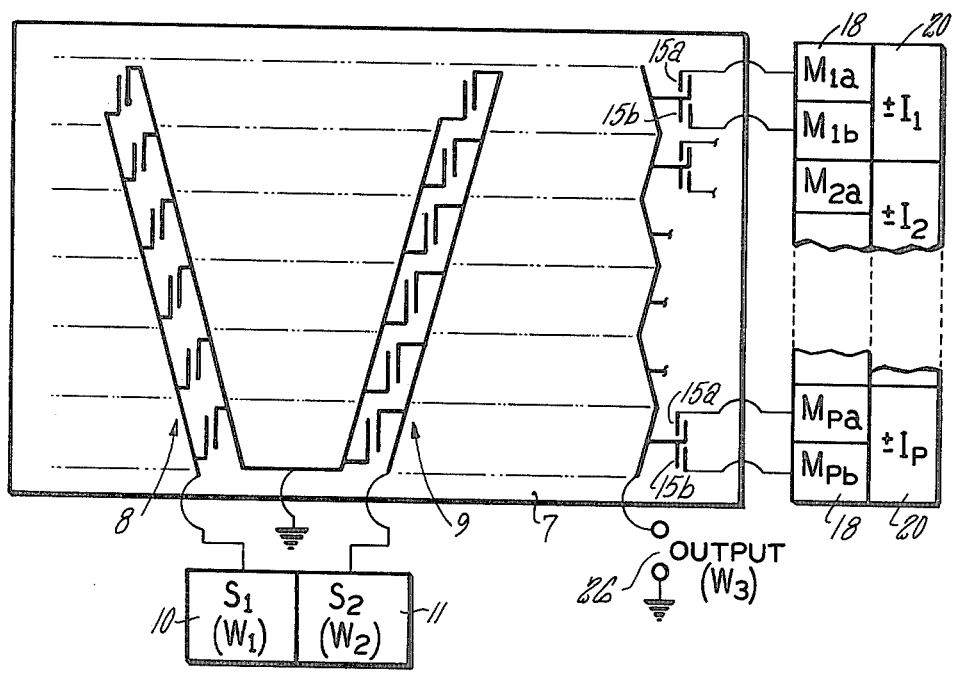
FIG. 3 is a simplified, schematic plan view of the invention embodied in a multi-channel form.

The invention may also be employed in other general configurations, as illustrated in FIGS. 2 and 3 in which the reference numerals identify parts corresponding to the parts of FIG. 1. In FIG. 2, counter-propagating waves are employed by virtue of the fact that the launching transducers 8, 9 are disposed on opposite ends of the interaction region 16. In this regard, the configuration of FIG. 2 is similar to that of the aforementioned Reeder and Gilden patent. However, the embodiment of FIG. 2 does depict utilization of programmable bias for the taps in the same fashion as the embodiment of FIG. 1, and is therefore also similar to the aforementioned Reeder and Grudkowski patent.

In FIG. 3, the configuration is similar to that of the aforementioned Reeder patent in which parallel processing channels are employed to allow variations in the launching distance of discrete wave components across P parallel channels. The common line connected between the taps 15 and the output 26 is shown in FIG. 3 as a meandering line, which may be employed directly on the substrate if desired, the meandering configuration reducing reflections as is known in the art. Alternatively, the common line connected between the taps 15 and the output 26 could be provided off the substrate, if desired. Because of the fact that the configurations of FIG. 2 and FIG. 3 conform to previous known configurations with the modification of the present invention, further description is not given herein. The embodiments disclosed herein all relate to the use of external mixing of the individual pairs of taps, the taps having the segments thereof arranged for equal phase centers with the other tap of the pair, but for opposite phase of waves acoustoelectrically produced thereby. In these embodiments, all of the components which are alike, but of opposite phase, are cancelled by summing the outputs of the mixers of the two taps in the pair. However, it is possible to utilize the invention in an internal mixing embodiment of the type described in commonly owned copending application of T. W. Grudkowski, PHASE AND AMPLITUDE PROGRAMMABLE INTERNAL MIXING SAW SIGNAL PROCESSOR, Ser. No. 967,323 filed on even date herewith. In the case of the internal mixing disclosed therein, the taps would have equal phase centers but segments disposed for opposite phase of waves acoustoelectrically produced thereat, and the bias controlling the mixing-effect at the taps would similarly be inverted with respect to the tap of each pair, the pairs being directly summed, whereby the components extracted from waves within the substrate would cancel whereas the double inversion (tap segments spacing and bias) would cause the desired component of bias-controlled internal mixing of the tap pair to be additive for double the normal output. However, it should be understood that, since the taps in such configuration can generally be designed with a center frequency specified for the sum or difference output of internal product mixing, and with a bandwidth which is far less than that required in externally mixing embodiments such as those disclosed herein, the need for use of the present invention in the internally mixed configuration of the aforementioned Grudkowski application is likely to be limited to cases where wide bandwidth taps are employed. However, in some applications not yet understood, the present invention may be combined with the internal mixing teachings of the aforementioned Grudkowski patent.

In contrast, typical internal mixing of the prior art has components related in phase to the transversal phase of the taps, and any attempt to cancel fundamentals by use of the present invention would also cancel the desired components.

The invention may be practiced in a variety of configurations, with equal or variable tap spacing, in tilted-tap, linear or parallel channel configurations, as well as in other configurations. The invention may be practiced with weighted mixer coefficients, either programmable or not, or with common coefficients. The invention may be utilized in a variety of processing applications including programmable and non-programmable signal correlation, phase equalizing, notch filtering, side lobe reduction, discrete Fourier transformation, controlled multiplexing, signal generation, time inversion and other functions concerning which the use of SAW signal processors are known. The invention may be utilized in a wide variety of configurations in addition to those disclosed herein, and may be practiced in modules fabricated in accordance with processes which are all well known in the art.

All of the foregoing variations are immaterial so long as there are provided tap pairs on the substrate having a like phase center with respect to waves in the substrate, but having the interdigital fingers thereof disposed such that waves produced at one tap are phase inverted from waves produced at the other tap in the pair, thereby to provide the common mode rejection for undesired wave components, while permitting a summation of desired components of product mixing corresponding to the taps of each pair. Similarly, although the invention has been shown and described with respect to exemplary embodiments thereof it should be understood by those skilled in the art that the foregoing and various other changes, omissions and additions may be made therein and thereto, without departing from the spirit and the scope of the invention.

Having thus described typical embodiments of our invention, that which we claim as new and desire to secure by Letters Patent is:

1. Differential surface acoustic wave, product mixing signal processing apparatus adapted to provide common mode rejection of unwanted signals and improved levels of desired components of product mixing of two fundamental surface acoustic waves, comprising:

a piezoelectric substrate having a pair of electroacoustic transducers for launching a pair of piezoelectric waves in said substrate and a plurality of segmented acoustoelectric transducer taps disposed on the surface of said substrate in a region thereof in which interaction of said piezoelectric waves occurs;

a pair of wave sources connected to said launching transducers for controlling electroacoustic launching of a pair of piezoelectric waves in the substrate; and means connected to each one of said taps for providing in conjunction with each tap components of nonlinear product mixing of piezoelectric waves propagating at the surface of said substrate adjacent to the related tap;

in which the improvement comprises:

each of said taps being arranged with another in a pair, both taps in each pair having a phase center displaced along the surface of said substrate a distance from one of said launching transducers which is the same as that of the other tap in the pair, both taps in each pair having the same design center frequency, the segments of the taps in each pair being arranged with respect to the phase center of the pair so as to acoustoelectrically reproduce electric signals at one tap of the pair in response to the two piezoelectric waves propagating in said substrate which are inverted in phase with respect to electric signals acoustoelectrically reproduced at the other one of said taps in the pair in response to the two piezoelectric signals propagating in said substrate; and means associated with each pair of taps for summing the components of nonlinear product mixing provided by both taps in said pair in conjunction with said means, whereby the electric signals reproduced from the two piezoelectric waves propagating in said substrate at one pair of taps are cancelled, while the desired components of nonlinear product mixing for said pair of taps are added.

2. Surface acoustic wave signal processing apparatus, comprising:

a piezoelectric substrate having a pair of electroacoustic transducers for launching a pair of piezoelectric waves in said substrate and a plurality of segmented acoustoelectric transducer taps disposed on the surface of said substrate in a region thereof in which interaction of said piezoelectric waves occurs;

a pair of wave sources connected to said launching transducers for controlling electroacoustic launching of a pair of piezoelectric waves in the substrate; and a plurality of nonlinear product mixing means, one for each of said taps, each connected to the corresponding one of said taps for providing components of nonlinear product mixing of piezoelectric waves propagating at the surface of said substrate adjacent to the related tap;

in which the improvement comprises:

each of said taps being arranged with another in a pair, both taps in each pair having a phase center displaced along the surface of said substrate a distance from one of said launching transducers which is the same as that of the other tap in the pair, both taps in each pair having the same design center frequency, the segments of the taps in each pair being arranged with respect to the phase center of the pair so as to acoustoelectrically produce electric signals at one tap of the pair in response to piezoelectric waves propagating in said substrate which are inverted in phase with respect to electric signals acoustoelectrically produced at the other one of said taps in the pair in response to piezoelectric signals propagating in said substrate; and means associated with each pair of taps and the related ones of said nonlinear product mixing means for summing the outputs of said nonlinear product mixing means, whereby the electric signals produced from piezoelectric waves propagating in said substrate at one pair of taps are cancelled, while the desired components of nonlinear product mixing for said pair of taps are added.

* * * * *